United States Patent [19]
Kolluri

[11] Patent Number: 5,808,514
[45] Date of Patent: Sep. 15, 1998

[54] THREE STATE OUTPUT METHOD AND APPARATUS FOR HIGH SPEED AMPLIFIERS

[75] Inventor: Madhav V. Kolluri, Sunnyvale, Calif.

[73] Assignee: Maxim Integrated Products, Inc., Sunnyvale, Calif.

[21] Appl. No.: 716,054

[22] Filed: Sep. 19, 1996

[51] Int. Cl.$^6$ .................................................. H03F 3/26
[52] U.S. Cl. .................................... 330/267; 330/298
[58] Field of Search .............................. 330/9, 51, 263, 330/267, 268, 298, 207 P

[56] References Cited

U.S. PATENT DOCUMENTS 4,530,026  7/1985  Noro .................................. 330/298 X
5,218,321  6/1993  Jost ..................................... 330/267 X Primary Examiner—Steven Mottola
Attorney, Agent, or Firm—Blakely, Sokoloff, Taylor & Zafman LLP

[57] ABSTRACT

Three state high speed amplifiers having a high output impedance when disabled and a minimum glitch when enabled and disabled. The amplifiers utilize complementary emitter followers for the output stage. When the amplifiers are disabled, circuitry provided for the purpose drives is responsive to the voltage on the output of the amplifier to maintain the base-emitter voltages of the output emitter followers at a substantially constant level below the turn-on voltages of the transistors, such as substantially zero volts. When the amplifier is enabled, the circuitry is also responsive to the voltage on the output of the amplifier, but this time to allow the base-emitter voltages of the output emitter followers to at least freely rise to the turn-on voltages of the transistors. Thus the reverse base-emitter voltage of the output transistors when the circuit is disabled is limited, and the output glitch on enable and disable is minimal because of the limited base-emitter voltage swing of the output transistors between disable and enable.

17 Claims, 5 Drawing Sheets

THREE STATE OUTPUT METHOD AND APPARATUS FOR HIGH SPEED AMPLIFIERS

BACKGROUND OF THE INVENTION

1. Field of the Invention

This invention relates to the field of high speed amplifiers.

2. Prior Art

The output stage of high speed amplifiers such as high speed video amplifiers are in many applications required to be placed in a high impedance mode. A high impedance mode allows the implementation of analog multiplexers, as illustrated in FIG. 1. In such a circuit application, only one of the amplifiers is enabled at any one time. The disabled outputs have to withstand the output swing of the enabled amplifier without damage and while maintaining its high impedance. The implementation of such a stage is difficult in typical high speed bipolar processes due to the low reverse base-emitter breakdown voltage of the transistors.

A typical class A-B output circuit used in high speed video amplifiers uses complementary emitter followers is shown in FIG. 2. One technique of disabling the output stage is to reduce the current's sources I1 and I2 to zero. With this technique, the output impedance can decrease at elevated temperatures due to leakage currents. Additionally, parasitic capacitances can provide base drive to the output transistors at high frequencies and cause the output impedance to degrade from its high Z values. In order to overcome these problems, the base-emitter junction of the output transistors Q1 and Q2 needs to be reverse biased throughout the range of the allowed output swing. This can be accomplished by adding switches S1 and S2, which are open when the output is enabled, and closed when the output is to be disabled. The problem with this approach is that the reverse base-emitter voltage across the output transistors Q1 and Q2 is dependent on the voltage at the output. Most high speed bipolar processes are characterized by low reverse base-emitter breakdown. Additionally, irreversible damage can occur to the transistors well below the rated junction breakdown. This places a limitation on the allowed output voltage in the high impedance mode.

The typical solution to this has been to place high breakdown diodes in series with the emitters, as shown in FIG. 3. The high breakdown diodes (usually Schottky diodes) absorb the reverse voltage and protect the fragile base-emitter junctions of the transistors. The series diodes reduce the normal output swing and degrade the output impedance and bandwidth of the circuit in its enabled mode.

BRIEF SUMMARY OF THE INVENTION

Three state high speed amplifiers having a high output impedance when disabled and a minimum glitch when enabled and disabled. The amplifiers utilize complementary emitter followers for the output stage. When the amplifiers are disabled, circuitry provided for the purpose drives is responsive to the voltage on the output of the amplifier to maintain the base-emitter voltages of the output emitter followers at a substantially constant level below the turn-on voltages of the transistors, such as substantially zero volts. When the amplifier is enabled, the circuitry is also responsive to the voltage on the output of the amplifier, but this time to allow the base-emitter voltages of the output emitter followers to at least freely rise to the turn-on voltages of the transistors. Thus the reverse base-emitter voltage of the output transistors when the circuit is disabled is limited, and the output glitch on enable and disable is minimal because of the limited base-emitter voltage swing of the output transistors between circuit disable and enable states.

DETAILED DESCRIPTION OF THE INVENTION

In accordance with the present invention, when the output of the high speed amplifier is disabled, the output voltage is sensed and used to drive the bases of the output transistors so as to turn the output transistors off in a manner to limit the reverse base-emitter voltage to a level well below the reverse base-emitter breakdown voltage of those transistors, regardless of the voltage on the output terminal. In the preferred embodiment, when the output is disabled, the applied voltage at the output is sensed and used to drive the base-emitter voltages of the output transistors to a controlled offset so as to turn the output transistors off. Thus, the reverse base-emitter voltage of the output transistors remains constant, independent of the applied output voltage. Conversely, when the amplifier output is enabled, the circuits driving the bases of the output transistors with a controlled offset when disabled now allow the bases of the output transistors to be driven responsive to the input to the amplifier in the normal manner.

Figure 1:
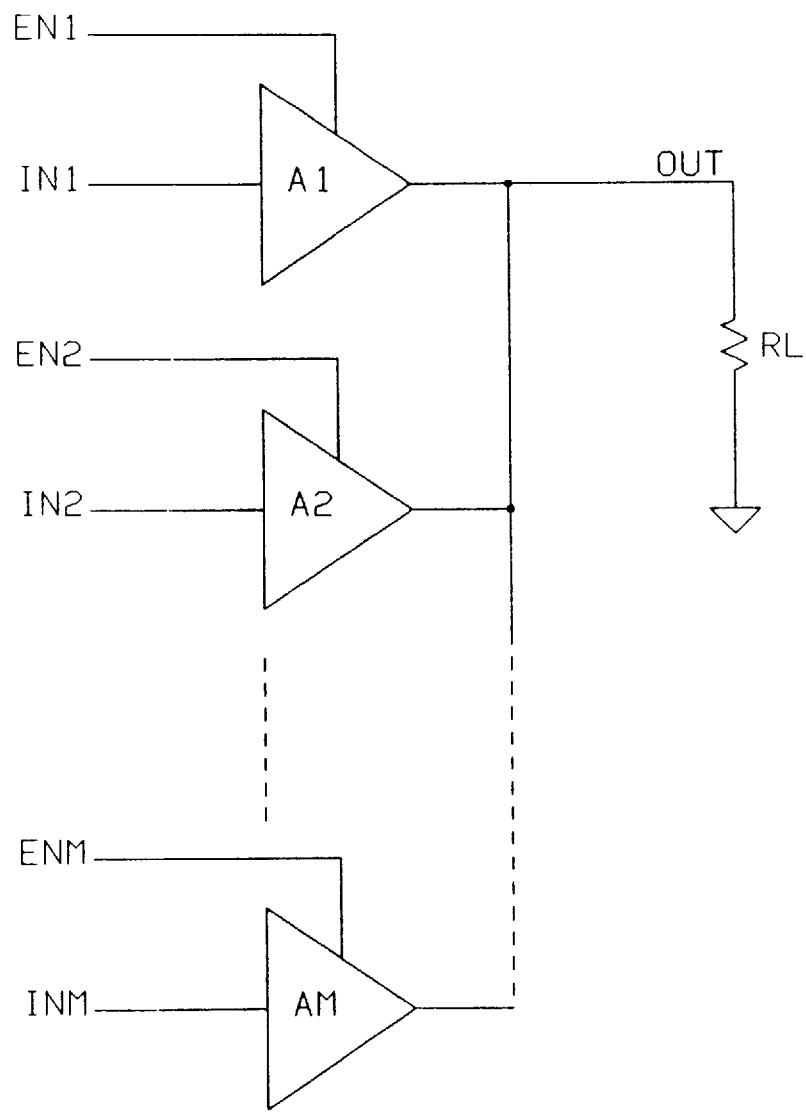
FIG. 1 illustrates the use of three state output high speed amplifiers in analog multiplexers.
Figure 2:
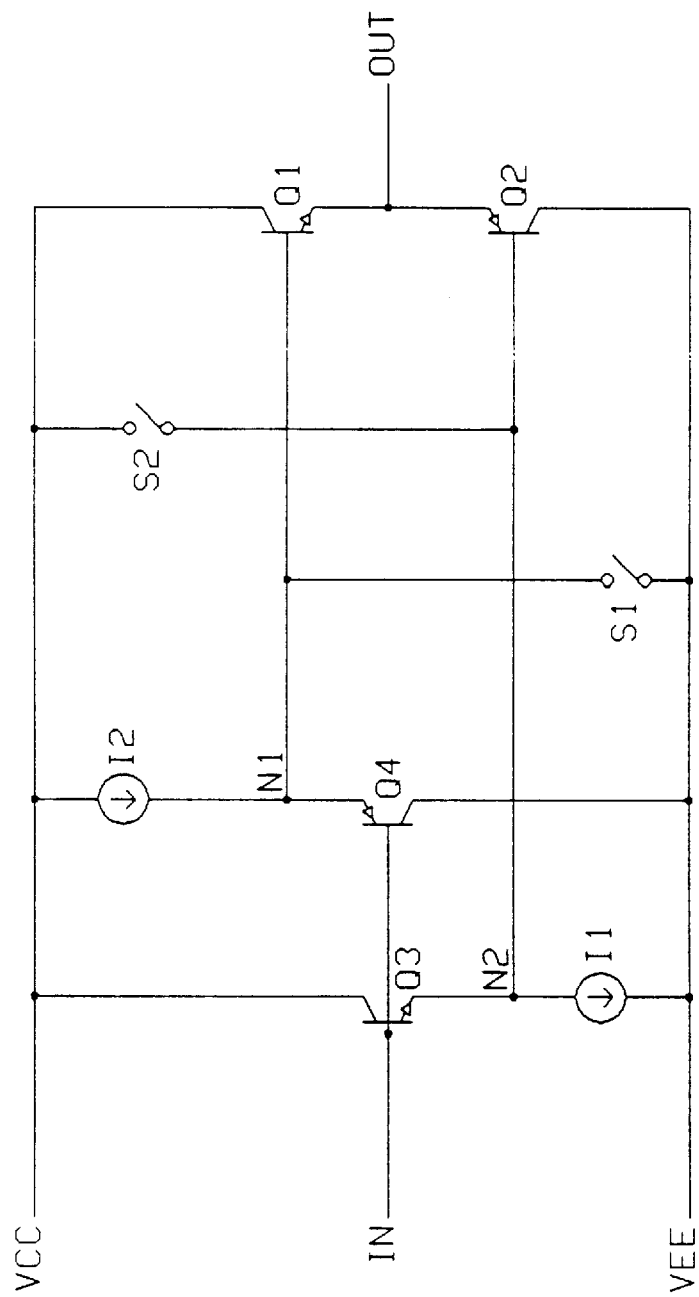
FIG. 2 is a circuit diagram for a typical prior art class A-B output circuit used in high speed video amplifiers.
Figure 3:
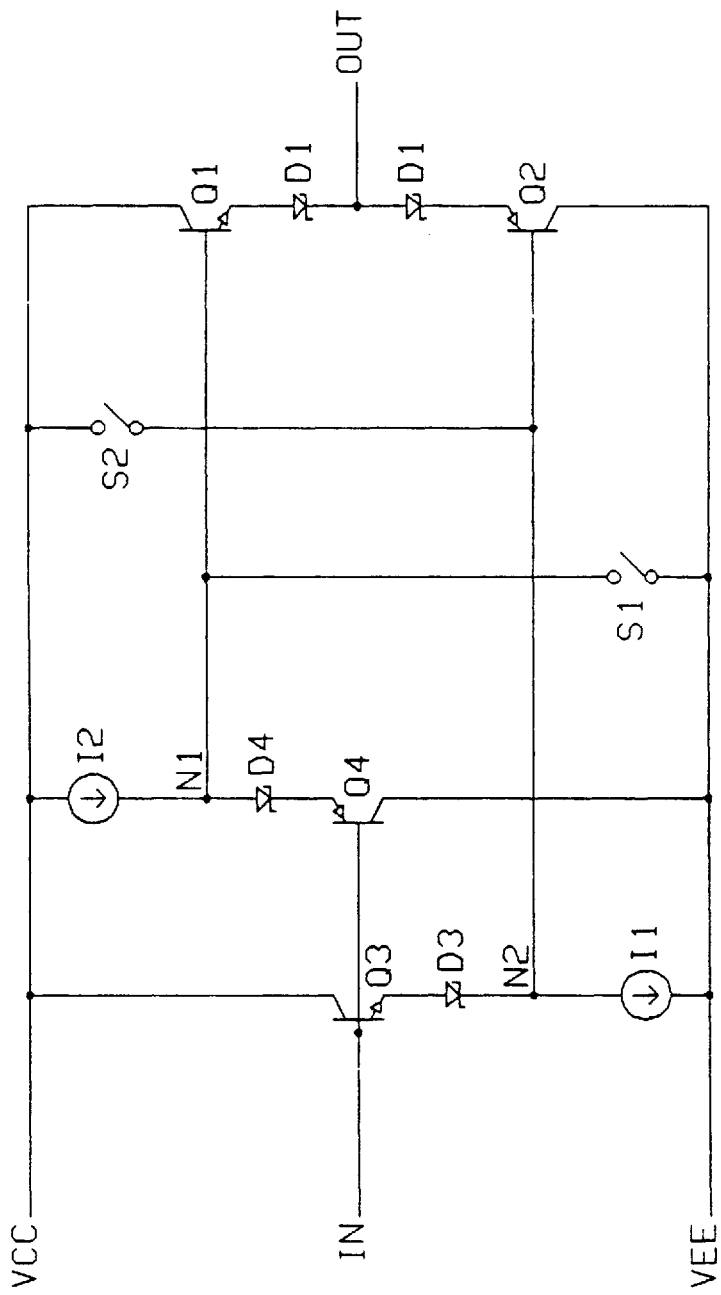
FIG. 3 is a circuit diagram illustrating the prior art placement of high breakdown diodes in series with the emitters of the amplifier of FIG. 2.
Figure 4:
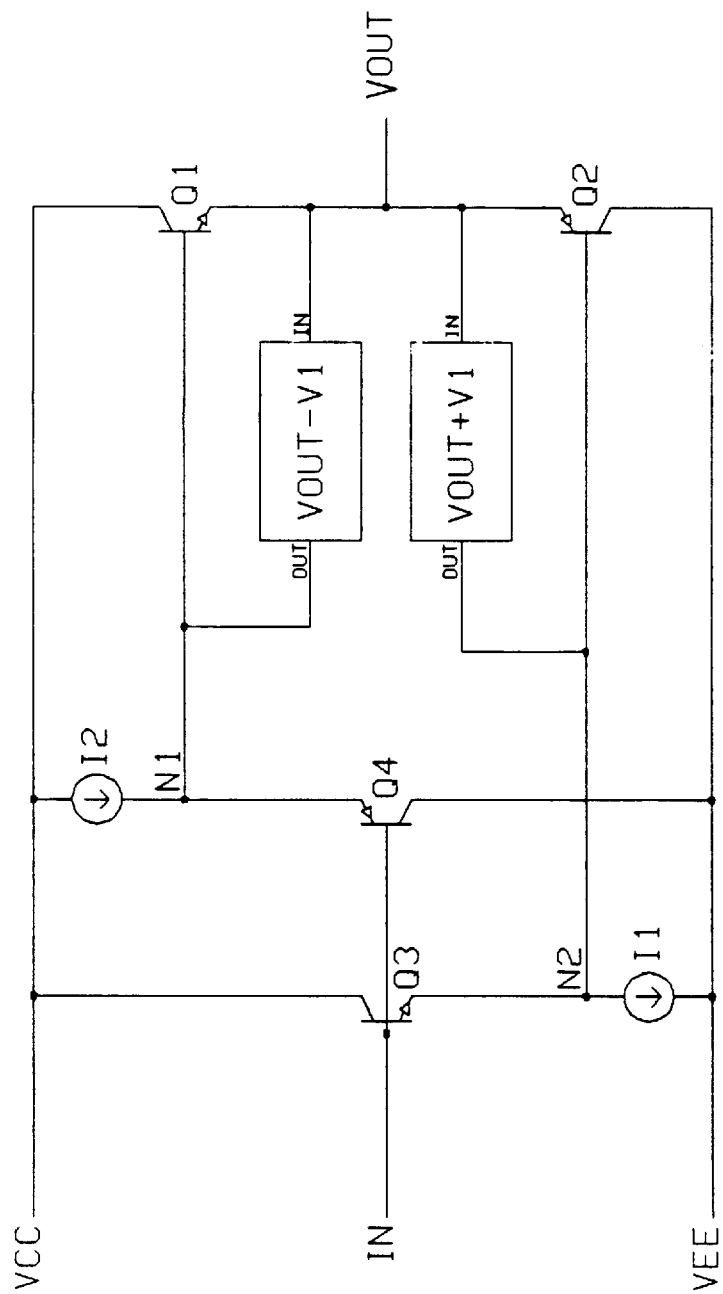
FIG. 4 is a circuit/block diagram schematically illustrating the principles of the preferred embodiment of the present invention.

The foregoing is illustrated in circuit/block diagram form in FIG. 4. Transistors Q1 through Q4 and current sources I1 and I2 form the basic high speed amplifier circuit. In this circuit, current source I2 would be sized to provide at least the maximum base current required by transistor Q1 for the maximum positive slewing of the output voltage VOUT with the intended load thereon. Similarly, current source I1 (technically a current sink, though the phrase "current source" will be used generically for both current sources and current sinks as is common in this technology) is sized to at least provide the base current for transistor Q2 adequate to provide the maximum negative slew rate by the output voltage VOUT with the intended load thereon.

Transistors Q3 and Q4 controlled by the input IN set the voltages of nodes N2 and N1 respectively, to one VBE (base-emitter voltage of a transistor when biased to conduction) below and one VBE above the input voltage IN, respectively. Since the output voltage VOUT is one VBE (Q1) below the voltage of N1 and one VBE (Q2) above the voltage the node N2, the output VOUT will follow the input with substantially unity voltage gain. However, when the output transistor base drive circuits, shown in block form in FIG. 4, are switched on as shown, the base of transistor Q1 is held at a voltage VOUT−V1 and the base of transistor Q2 is held to a voltage VOUT +V1. Thus, the reverse base-emitter voltage of both transistors Q1 and Q2 is held to an offset voltage V1, independent of the output voltage VOUT.

Selecting this offset voltage V1 to be substantially below the reverse base emitter breakdown voltage assures that neither transistor Q1 nor transistor Q2 will breakdown, independent of the output voltage VOUT. In the preferred embodiment, subsequently disclosed in full circuit detail herein, the offset voltage V1 is substantially zero, though this is merely an exemplary embodiment, as other offset voltages, substantially constant or variable, below the reverse base-emitter breakdown voltages of transistors Q1 and Q2 may be used as desired.

To provide the base drives of VOUT−V1 and VOUT+V1 for transistors Q1 and Q2 respectively, the base drive circuits merely need to divert the base drive currents from current sources I2 and I1 from the bases of transistors Q1 and Q2, respectively, to the appropriate power supply line when clamping the base voltages of transistors Q1 and Q2 to VOUT−V1 and VOUT+V1 respectively. In that regard, the power supply connection for the blocks generating the base voltages VOUT−V1 and VOUT+V1 are not shown in FIG. 4, but are present in the actual circuit, avoiding current flow into or out of the output node VOUT from these circuits.

Figure 5:
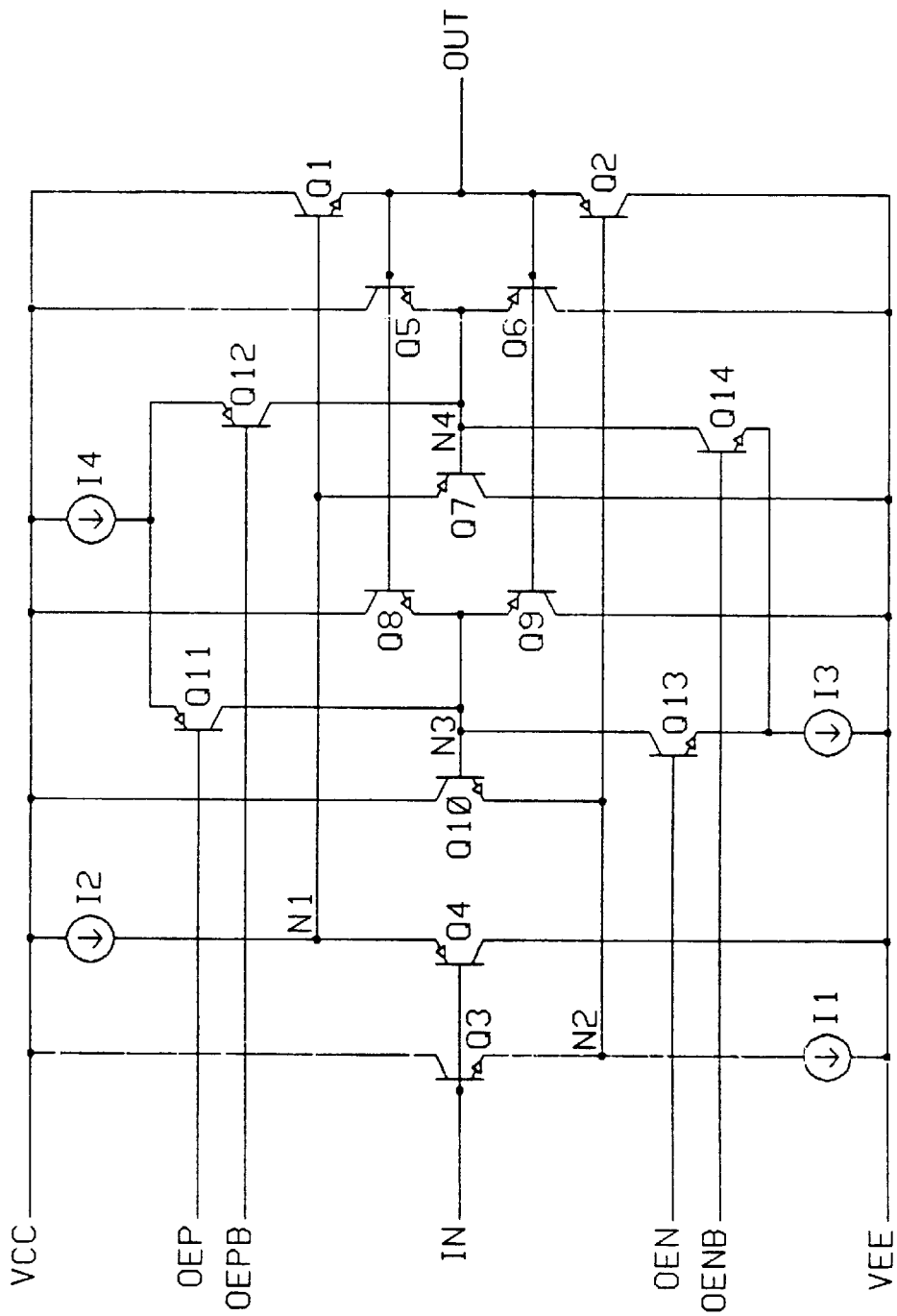
FIG. 5 is a detailed circuit diagram for an exemplary embodiment of the present invention.

Now referring to FIG. 5, a detailed circuit diagram for an exemplary embodiment of the present invention may be seen. In this Figure, transistors Q1 through Q4 and current sources I1 and I2 provide the basic amplifier hereinbefore described with respect to FIG. 4, typically used as the output stage of a larger amplifier circuit. The circuit shown is enabled and disabled by certain two state enable signals, mainly output enable positive OEP and output enable negative OEN signals, and their inverses, output enable positive bar OEPB and output enable negative bar OENB signals, respectively.

In the circuit shown in FIG. 5, transistors Q5 through Q14 together with current sources I3 and I4 form a switch circuit, which either enables or disables the output stage by controlling the base drive for output transistors Q1 and Q2 by controlling the voltages at nodes N1 and N2 relative to the output VOUT. In this circuit, complementary emitter followers Q5 and Q6 sense the voltage at the output VOUT, with a common emitter node N4 being one VBE (Q6) above or one VBE (Q5) below VOUT, depending upon whether current is flowing into the node N4 or out of the node N4, respectively. Similarly, complementary emitter follower transistors Q8 and Q9 also sense the voltage at the output VOUT, with the common emitter node N3 being at one VBE (Q9) above the output voltage VOUT or one VBE (Q8) below the output voltage VOUT, depending on whether there is current flow into or out of node N3, respectively.

When the output VOUT is enabled, the output enable signals OEP and OEN will both be high, with their inverses OEPB and OENB being low. OEP high turns off transistor Q11 and OEPB low turns on transistor Q12, allowing the current I4 to flow through transistor Q12 and transistor Q6 to VEE. Since current is flowing into node N4, the voltage of node N4 will be one VBE (Q6) above the output voltage VOUT. Since the voltage of node N1 cannot be more than one VBE (Q1) above the voltage VOUT, the base-emitter voltage of transistor Q7 is substantially zero and the same will therefore be off. Consequently, current source I2 and transistor Q4 are free to determine the voltage of node N1 in accordance with the normal operation of the output amplifier.

Similarly, with OEN high and OENB low, transistor Q14 will be turned off and transistor Q13 will be turned on. This allows current source I3 to pull current from node N3, dropping the voltage of node N3 to one VBE (Q8) below VOUT, at which voltage transistor Q8 turns on to supply current to the node to hold the same at that voltage. Since node N2 is now one VBE (Q2) below the voltage VOUT and node N3 is now one VBE below the output voltage VOUT, transistor Q10 will be off, allowing transistor Q3 and current source I1 to control the voltage of and the current out of node N2 in accordance with normal amplifier operation.

When the circuit is disabled, the output enable signal OEP will be low and its inverse OEPB will be high. This turns off transistor Q12 and turns on transistor Q11, directing the current from current source I4 to node N3, pulling node N3 one VBE (Q9) above the output voltage VOUT to turn on transistor Q9 and to hold the voltage N3 at that level. With the voltage at node N3 one VBE above the voltage VOUT, transistor Q10 will turn on, pulling the voltage of node N2 to one VBE below the voltage of node N3. Since the voltage of node N3 is one VBE above the voltage VOUT, transistor Q10 pulls the voltage of node N2 to VOUT, clamping the base-emitter voltage of transistor Q2 at substantially zero volts, independent of what the voltage VOUT may be.

Similarly when the circuit is disabled, the output enable signal OEN will be low and its inverse OENB will be high. This turns off transistor Q13 and turns on Q14, pulling the voltage of node N4 one VBE (Q5) below the voltage VOUT before transistor Q5 turns on to clamp the voltage of node N4 one VBE below VOUT. The voltage at node N4 turns on transistor Q7 to pull the voltage of node N1 to one VBE above the voltage of node N4. Since the voltage of node N4 is one VBE below VOUT, the voltage of node N1 will now be substantially equal to VOUT, clamping the base-emitter voltage of transistor Q1 at substantially zero volts, independent of the swing of the output voltage VOUT. Thus, when the circuit is disabled, the base-emitter voltages of the output transistors Q1 and Q2 are both held at substantially zero volts, holding the two output transistors off, independent of the input voltage IN, independent of the output voltage VOUT as driven by some other transistor connected in parallel therewith, and independent of the current sources I1 and I2.

It can be seen from the foregoing description that in the exemplary embodiment, nodes N3 and N4 undergo the same voltage swings as the output voltage VOUT. The current sources I3 and I4 need only be large enough to provide the required slew rates for nodes N3 and N4. Also, the voltage swing (total change in offset) of nodes N3 and N4 between the circuit enabled and circuit disabled conditions is only two VBE (independent of what the actual output voltage VOUT might be at the instant of enablement or disablement), minimizing internally generated circuit switching glitch. Also the actual base-emitter voltage swing of the output transistors Q1 and Q2 between circuit disable and circuit enable is only one VBE. This grossly reduces the switching glitch otherwise encountered in other designs, wherein the capacitive coupling between the base and emitter of the output transistors, together with the large base-emitter voltage change from and to a large reverse base-emitter voltage of the output transistors, causes a glitch in the output, forming a discernible "pop" or "tick" in an audio signal, or a visible short term disturbance in a video signal.

While the present invention has been disclosed and described with respect to a certain preferred embodiments thereof, it will be understood to those skilled in the art that the present invention may be varied without departing from the spirit and scope of the invention.

I claim:

1. A high speed amplifier having a low output impedance when enabled and a high output impedance when disabled comprising:

first and second complimentary transistors each having an emitter, a base and a collector, the first and second complimentary transistors having their emitters coupled together and to an amplifier output, and their collectors coupled to first and second power supply terminals respectively;

a first circuit coupled to the bases of the first and second transistors controllably providing currents to control the output responsive to an amplifier input;

a second circuit coupled to the bases of the first and second transistors and to the amplifier output, the second circuit providing controlled base-emitter voltages, independent of the amplifier output, to the first and second transistors to hold the first and second transistors off when the amplifier is disabled, and not effecting the base-emitter voltages of the first and second transistors when the amplifier is enabled.

2. The high speed amplifier of claim 1 wherein the second circuit provides approximately zero base-emitter voltages to the first and second transistors to hold the first and second transistors off when the amplifier is disabled.

3. The high speed amplifier of claim 2 wherein the approximately zero base-emitter voltages provided to the first and second transistors to hold the first and second transistors off when the amplifier is disabled are voltages equal to the amplifier output plus the difference in the base-emitter voltages of two additional transistors, each having an emitter, a base and a collector.

4. The high speed amplifier of claim 1 wherein the first circuit comprises third and fourth complimentary transistors each having an emitter, a base and a collector, the bases of the third and fourth transistors being coupled to an amplifier input, the emitters of each of the third and fourth transistors being coupled to a current source and to the base of the complementary one of the first and second transistors, and the collectors of the third and fourth transistors being coupled to first and second power supply terminals.

5. The high speed amplifier of claim 1 wherein the second circuit includes first and second nodes, the second circuit causing the voltage of the first and second nodes to track the amplifier output within a magnitude of one VBE when the amplifier is enabled and to track the amplifier output within a magnitude of one VBE when the amplifier is disabled.

6. The high speed amplifier of claim 5 wherein the second circuit changes the voltage of each of the first and second nodes by 2 VBE between when the amplifier is enabled and when it is disabled.

7. A method of operating a high speed amplifier to provide a low output impedance when enabled and a high output impedance when disabled:

the amplifier having;
first and second complimentary transistors each having an emitter, a base and a collector, the first and second complimentary transistors having their emitters coupled together and to an amplifier output, and their collectors coupled to first and second power supply terminals respectively;
a first circuit coupled to the bases of the first and second transistors controllably providing currents to control the output responsive to an amplifier input;

the method comprising the steps of;
a) holding the base-emitter voltages of the first and second transistors to values substantially independent of the amplifier output to hold the first and second transistors off when the amplifier is disabled; and,
b) not effecting the base-emitter voltages of the first and second transistors when the amplifier is enabled.

8. The method of claim 7 wherein in step a), the base-emitter voltages of the first and second transistors are held to substantially zero volts.

9. The method of claim 8 wherein in step a) the approximately zero base-emitter voltages of the first and second transistors are voltages equal to the amplifier output plus the difference in the base-emitter voltages of two additional transistors, each having an emitter, a base and a collector.

10. The method of claim 7 wherein the second circuit includes first and second nodes, the voltage of the first and second nodes tracking the amplifier output within one VBE when the amplifier is enabled and tracking the amplifier output within one VBE when the amplifier is disabled.

11. The method of claim 10 wherein the voltage of each of the first and second nodes changes by 2 VBE between when the amplifier is enabled and when it is disabled.

12. In a high speed amplifier having a low output impedance when enabled and a high output impedance when disabled, a circuit coupled to an output transistor having an emitter coupled to an amplifier output, a collector coupled to a first power supply terminal, and a base coupled to an input circuit which controllably provides current to control the output responsive to an amplifier input, the circuit comprising:

a first transistor of a first conductivity type having an emitter, a base coupled to the amplifier output, and a collector coupled to the first power supply terminal;

a second transistor of a second conductivity type having an emitter coupled to the base of the output transistor, a base coupled to a switched current source and the emitter of the first transistor, and a collector coupled to a second power supply terminal;

wherein the first and second transistors hold the output transistor off by providing a zero base-emitter voltage, independent of the amplifier output, when the amplifier is disabled, and not effecting the base-emitter voltage of the output transistor when the amplifier is enabled.

13. The circuit of claim 12 wherein the switched current source comprises:

a control signal; and
a third transistor of the first conductivity type, having an emitter coupled to the second power supply terminal through a current source, a collector coupled to the base of the second transistor, and a base coupled to the control signal, the control signal enabling the third transistor when the amplifier is disabled and disabling the third transistor when the amplifier is enabled.

14. The circuit of claim 12 wherein the approximately zero base-emitter voltage provided to the output transistor to hold the output transistor off when the amplifier is disabled is a voltage equal to the amplifier output plus the difference in the base-emitter voltages of the first and second transistors.

15. The circuit of claim 12 wherein the first circuit comprises a fourth transistor of the second conductivity type having an emitter coupled to the first power supply terminal through a second current source and to the emitter of the second transistor, a base coupled to the amplifier input, and a collector coupled to the second power supply terminal.

16. The circuit of claim 12 further comprising a node, wherein the voltage of the node tracks the amplifier output within a magnitude of one VBE when the amplifier is enabled and tracks the amplifier output within a magnitude of one VBE when the amplifier is disabled.

17. The circuit of claim 16 wherein the node voltage changes by 2 VBE between when the amplifier is enabled and when it is disabled.

* * * * *